United States Patent
Lau et al.

(10) Patent No.: US 6,469,555 B1
(45) Date of Patent: Oct. 22, 2002

(54) APPARATUS AND METHOD FOR GENERATING MULTIPLE CLOCK SIGNALS FROM A SINGLE LOOP CIRCUIT

(75) Inventors: Benedict C. Lau, San Jose; Stefanos Sidiropoulos, Palo Alto, both of CA (US)

(73) Assignee: Rambus, Inc, Los Altos, CA (US)

( * ) Notice: Subject to any disclaimer, the term of this patent is extended or adjusted under 35 U.S.C. 154(b) by 0 days.

(21) Appl. No.: 09/642,484

(22) Filed: Aug. 18, 2000

(51) Int. Cl.[7] .................................................. H03L 7/06
(52) U.S. Cl. ........................................ 327/158; 327/161
(58) Field of Search ................................. 327/141, 158, 327/159, 161–163

(56) References Cited

U.S. PATENT DOCUMENTS 6,140,854 A * 10/2000 Coddington et al. ........ 327/158
6,229,363 B1 * 5/2001 Eto et al. .................... 327/158

* cited by examiner

*Primary Examiner*—Kenneth B. Wells
(74) *Attorney, Agent, or Firm*—Lee & hayes, PLLC

(57) ABSTRACT

A delay-locked loop circuit generates a first clock signal. The delay-locked loop circuit includes a first delay element coupled in a feedback path of the delay-locked loop circuit to advance the first clock signal relative to a reference clock signal by a first time period. A second delay element is coupled to receive the first clock signal from the delay-locked loop circuit. The second delay element also outputs a second clock signal that is delayed relative to the first clock signal by the first time period. The delay-locked loop circuit may include a phase detector to identify phase differences between the first clock signal and the reference clock signal. A third delay element may be coupled between the delay-locked loop circuit and the second delay element.

7 Claims, 9 Drawing Sheets

APPARATUS AND METHOD FOR GENERATING MULTIPLE CLOCK SIGNALS FROM A SINGLE LOOP CIRCUIT

TECHNICAL FIELD

The present invention relates to clock circuitry and, more particularly, to methods and circuits that generate clock signals indicating when to read and write data on a bus.

BACKGROUND

Clock signals are used in electrical circuits to control the flow of data on data communication busses and control the timing and processing of various functions. In particular systems, data is written to a data bus or read from the data bus based on the state of one or more clock signals. These clock signals are necessary to prevent "collision" of data, i.e., the simultaneous transmission of data by two different devices on the same data bus. The clock signals also ensure that the desired data is available on the data bus when read by a device.

FIG. 1 illustrates a particular example of a data storage system 100. A memory controller 102 controls the writing and reading of data to and from one or more memory storage modules 104, 106, and 108. Memory storage modules 104, 106, and 108 may contain any number of memory storage devices, such as random access memories (RAMs). The memory controller 102 and memory storage modules 104–108 are coupled to a data bus 110 and a clock signal transmitted on a pair of lines 112a and 112b. The clock signal may be single-ended or differential. The data bus 110 communicates data between the memory storage modules 104–108 and the memory controller 102. Lines 112a and 112b transmit a clock signal generated by a clock generator 120, coupled to line 112a. Line 112a is "looped back" to line 112b as it passes through memory controller 102. The clock signal carried by line 112a may be referred to as CTM (clock to master or clock to memory controller) and the clock signal carried by line 112b may be referred to as CFM (clock from master or clock from memory controller). Line 112b and each of the lines in data bus 110 are terminated through a resistor 114, which is coupled to Vcc.

FIG. 2 is a timing diagram illustrating the process for reading data from a data bus and writing data to a data bus, such as data bus 110 discussed above with respect to FIG. 1. The signal "BUS CLK" is the bus clock signal that sets the timing for data read and write operations on the data bus. In this example, BUS CLK is a square wave signal having a 50% duty cycle. Both edges of BUS CLK are centered on the corresponding data. Data is transmitted on the data bus corresponding to the rising edge of BUS CLK (referred to as "odd data") and corresponding to the falling edge of BUS CLK (referred to as "even data"). Thus, data is transmitted twice during each cycle of BUS CLK plus an output driver delay (Tod). A signal T-CLK, which identifies when data is transmitted on the data bus, is 90 degrees ahead of BUS CLK. Another signal R-CLK, which identifies when data is read from the data bus, is aligned with BUS CLK. A DATA signal indicates when data is available on the data bus.

As shown in FIG. 2, the R-CLK signal is adjusted to account for the setup time (Tsu) necessary to communicate the appropriate data to the data bus. To ensure that the edge of BUS CLK aligns with the center of the available data, the 90 degree center point of the data on the data bus must be Tsu seconds before the corresponding sampling edge of the internal R-CLK.

FIG. 3 illustrates a circuit 150 capable of generating the T-CLK and R-CLK signals shown in FIG. 2. Circuit 150 is contained in a memory controller, such as the memory controller shown in FIG. 1. The circuit 150 includes a first delay-locked loop to generate R-CLK and includes a second delay-locked loop to generate T-CLK. A clock amplifier 152 receives the BUS CLK signal, amplifies the BUS CLK signal, and provides a differential signal having a 50% duty cycle and the desirable common mode to a reference loop 154. Reference loop 154 creates a quadrature wave form and provides that signal to a pair of fine loop circuits 156 and 166. Each fine loop circuit 156 and 166 forms part of a delay-locked loop. Fine loop circuit 156, in combination with a clock buffer 158 and a phase detector 164 form a first delay-locked loop, which generates the R-CLK signal. Phase detector 164 identifies the current phase of the R-CLK signal and provides an adjustment signal to fine loop circuit 156. This adjustment is necessary to account for the setup time (Tsu) necessary to communicate the appropriate data to the data bus. The delay-locked loop created by fine loop 156, clock buffer 158 and phase detector 164 ensures that the proper setup time Tsu is taken into account when generating the R-CLK signal. Thus, a receiver 160 will retrieve data from a bus 162 at the appropriate time (i.e., at the center of the valid data).

Fine loop circuit 166, in combination with a clock buffer 168, a delay device 172, and a quadrature phase detector 174 form a second delay-locked loop, which generates the T-CLK signal. Quadrature phase detector 174 creates the necessary 90 degree shift of the T-CLK signal from the BUS CLK signal (see FIG. 2) by providing the appropriate adjustment signal to fine loop circuit 166. Additionally, the adjustment signal provided by delay device 172 is necessary to account for the output driver delay (Tod), discussed above. The delay-locked loop created by fine loop 166, clock buffer 168, delay device 172, and quadrature phase detector 174 creates the necessary alignment of data with the T-CLK signal. Thus, an output driver 170 will drive data onto the bus 162 at the appropriate time.

The circuit described above with respect to FIG. 3 requires two separate delay-locked loops to generate the R-CLK and the T-CLK signals. The use of two delay-locked loops requires a significant amount of power and uses a significant amount of layout area within the memory controller.

An improved architecture described herein addresses these and other problems by simplifying the circuit that generates the R-CLK and the T-CLK signals.

SUMMARY

The improved architecture discussed below generates the R-CLK and T-CLK signals using a single delay-locked loop. The use of a single delay-locked loop requires fewer components and reduces the power consumption of the circuit as compared to the circuit described above in FIG. 3. Additionally, the improved architecture requires less area within the memory controller.

In one embodiment, a delay-locked loop circuit generates a first clock signal. The delay-locked loop circuit includes a first delay element coupled in a feedback path of the delay-locked loop circuit to advance the first clock signal relative to a reference clock signal by a first time period. A second delay element is coupled to receive the first clock signal from the delay-locked loop circuit and to output a second clock signal that is delayed relative to the first clock signal by the first time period.

In another embodiment, the delay-locked loop circuit further includes a phase detector to identify phase differences between the first clock signal and the reference clock signal.

In one embodiment, the phase detector is an integration sampler to integrate the first clock signal against the reference clock signal.

In a described implementation, the delay-locked loop circuit includes a 180 degree phase shifter to adjust the phase of the first clock signal.

In a particular embodiment, a third delay element is coupled between the delay-locked loop circuit and the second delay element.

DETAILED DESCRIPTION

An improved architecture is discussed herein for generating the R-CLK and T-CLK signals using a single delay-locked loop. The use of a single delay-locked loop requires fewer components, reduces the power consumption of the circuit, and requires less layout area within the memory controller.

Figure 4:
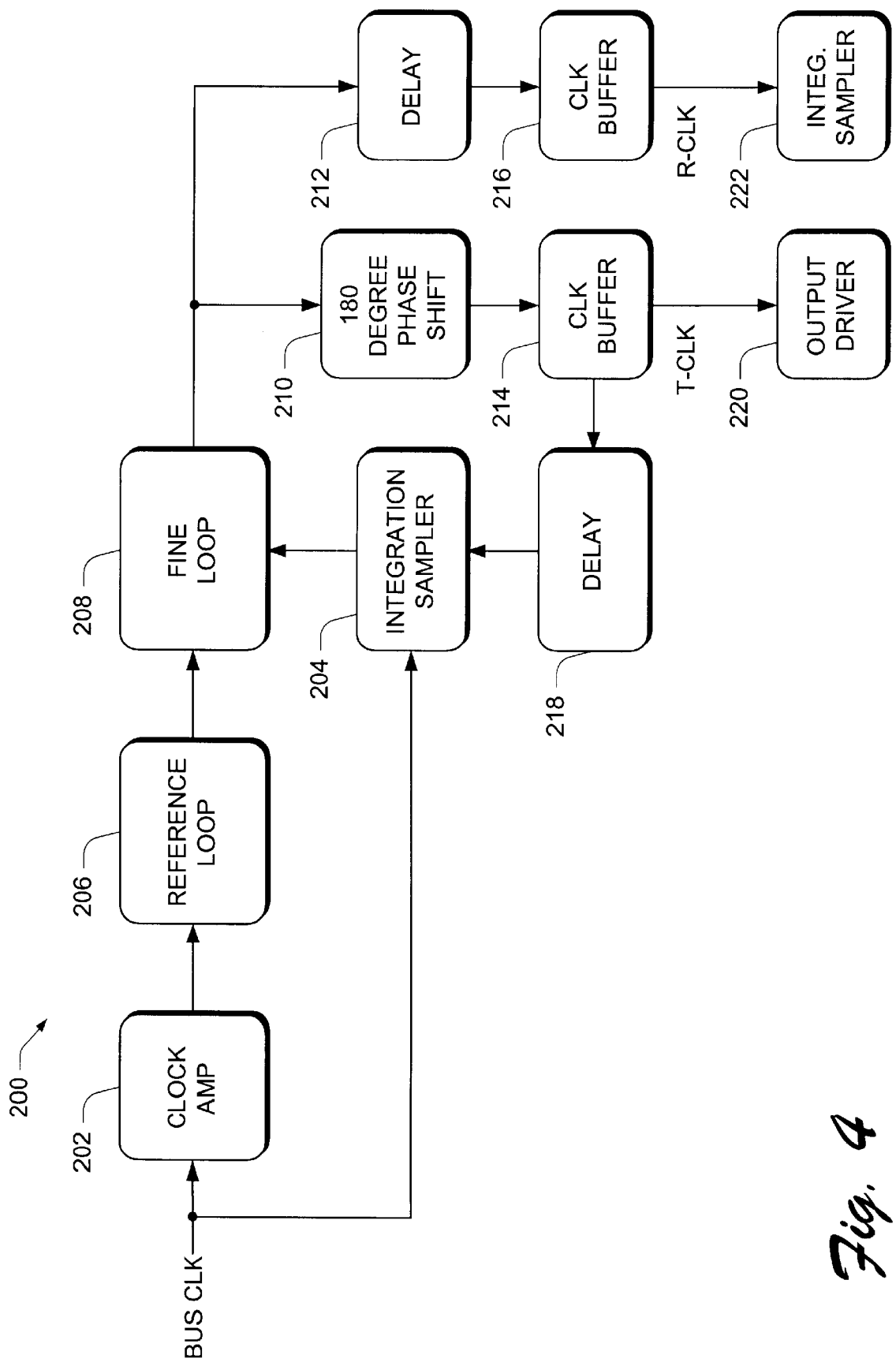
FIG. 4 illustrates an improved circuit capable of generating the T-CLK and R-CLK signals.

FIG. 4 illustrates an improved circuit 200 capable of generating the T-CLK and R-CLK signals. In particular embodiments, circuit 200 is contained in a memory controller or other control device responsible for generating clock signals for accessing and/or communicating data. The circuit receives the BUS CLK signal, which is provided as a reference clock to a clock amplifier 202 and an integration sampler 204. Clock amplifier 202 amplifies the BUS CLK signal and provides the amplified signal to a reference loop 206. The reference loop 206 creates a quadrature wave form and provides the wave form to a fine loop circuit 208. The fine loop circuit 208 generates a single clock signal output that is provided to a delay circuit 212 and a 180 degree phase shift circuit 210. In an alternate embodiment of the invention, the 180 degree phase shift circuit 210 is located within the fine loop circuit 208. Delay circuit 212 compensates for the delay introduced into the signal by another delay circuit 218. Delay circuit 212 "compensates" for the delay by removing the delay introduced by delay circuit 218. Delay circuit 218 introduces the delay to compensate for the delay caused by an output driver 220 in making data available on the data bus. Delay circuits 212 and 218 may also be referred to as delay devices, delay elements, delay components, etc.

The output of delay circuit 212 is coupled to a clock buffer 216, the output of which is the R-CLK signal. The R-CLK signal is provided to an integration sampler 222. The output of the 180 degree phase shift circuit 210 is coupled to another clock buffer 214, the output of which is the T-CLK signal. The T-CLK signal is provided to the output driver 220 and delay circuit 218.

Figure 2:
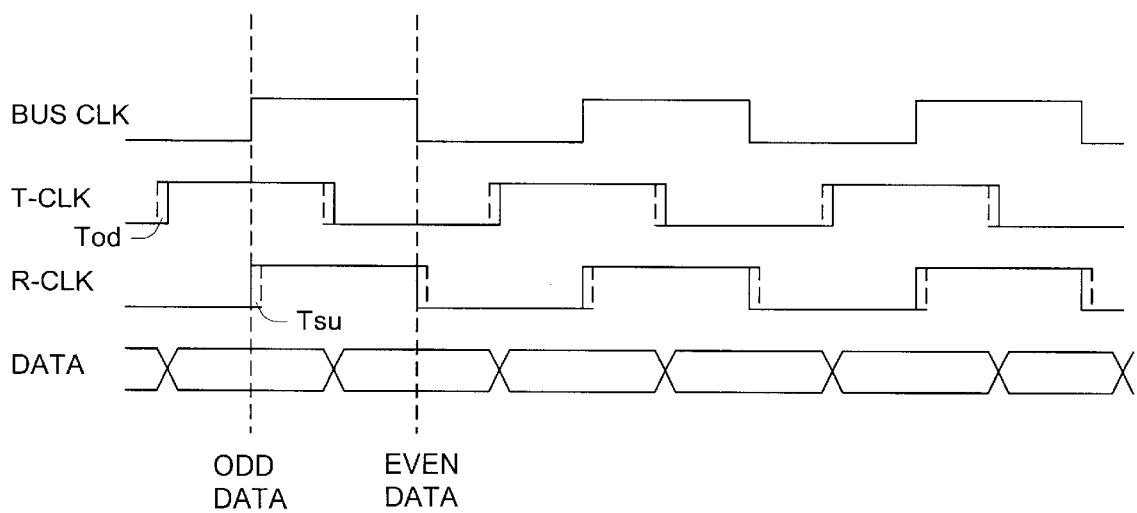
FIG. 2 is a timing diagram illustrating the process for reading data from a data bus and writing data to a data bus, such as the data bus shown in FIG. 1.
Figure 3:
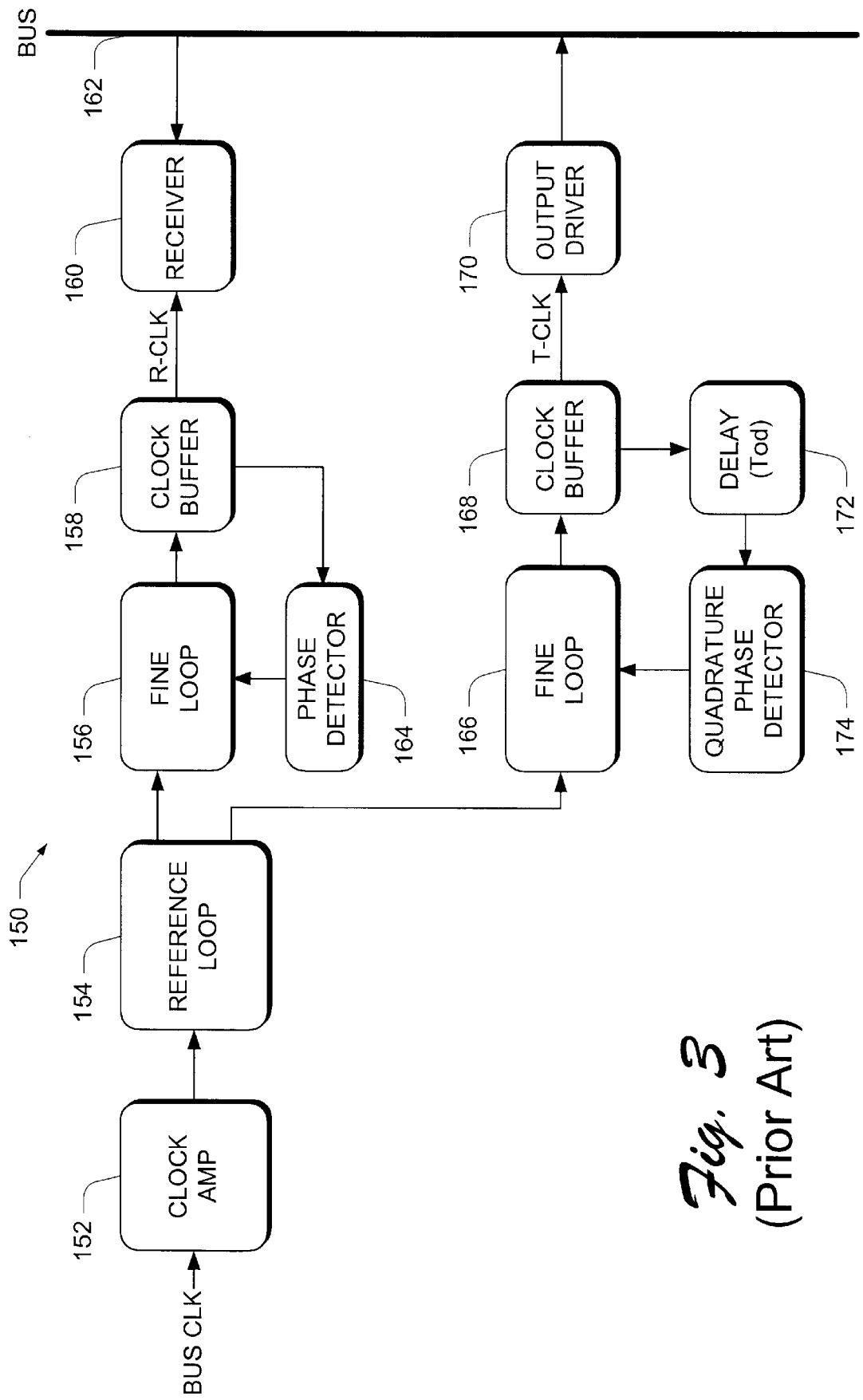
FIG. 3 illustrates a circuit capable of generating the T-CLK and R-CLK signals shown in FIG. 2.

Since the clock signal is created and transmitted differentially, the 180 degree phase shift circuit 210 reverses the two clock signal conductors, thereby shifting the phase of the clock signal by 180 degrees. This 180 degree phase shift is necessary to maintain the relationship between the odd data and the even data (see FIG. 2), where odd data is sampled on the rising edge of the clock signal and the even data is sampled on the falling edge of the clock signal.

A delay-locked loop circuit is formed by fine loop circuit 208, 180 degree phase shift circuit 210, clock buffer 214, delay circuit 218, and integration sampler 204. The delay circuit 218 compensates for the delay caused by the output driver 220. The output of delay circuit 218 is provided to the integration sampler 204, the operation of which is discussed below. Since the delay circuit 218 is located in the feedback path of the delay-locked loop circuit, the delay caused by delay circuit 218 causes fine loop circuit 208 to advance the clock signal (T-CLK) relative to the reference clock signal (i.e., BUS CLK). The clock signal is advanced by a period equal to the delay caused by delay circuit 218.

Thus, as shown in FIG. 4, the circuit 200 includes a single delay-locked loop, created by fine loop 208, 180 degree phase shift circuit 210, clock buffer 214, delay circuit 218, and integration sampler 204. Since delay-locked loops consume a significant amount of power, the use of a single delay-locked loop (rather than multiple delay-locked loops) significantly reduces the power consumption of the memory controller.

Figure 5:
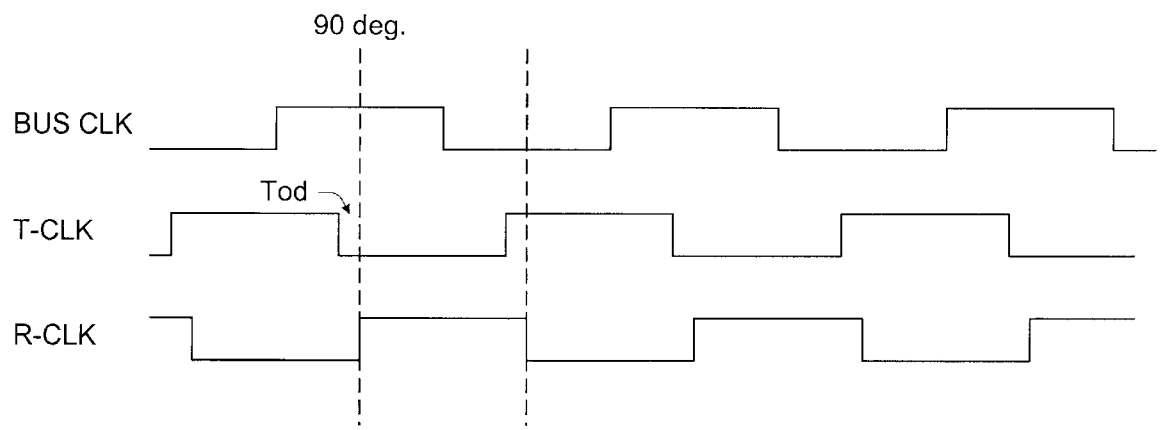
FIG. 5 is a timing diagram illustrating the timing of various signals in the circuit of FIG. 4.

FIG. 5 is a timing diagram illustrating the timing of various signals in the circuit of FIG. 4. As shown in FIG. 5, the BUS CLK signal leads the R-CLK signal by 90 degrees (i.e., the rising edge of BUS CLK occurs 90 degrees ahead of the rising edge of R-CLK). The T-CLK signal is approximately 180 degrees out of phase with the R-CLK signal. The T-CLK signal is offset slightly due to the delay caused by the output driver (Tod).

Figure 6:
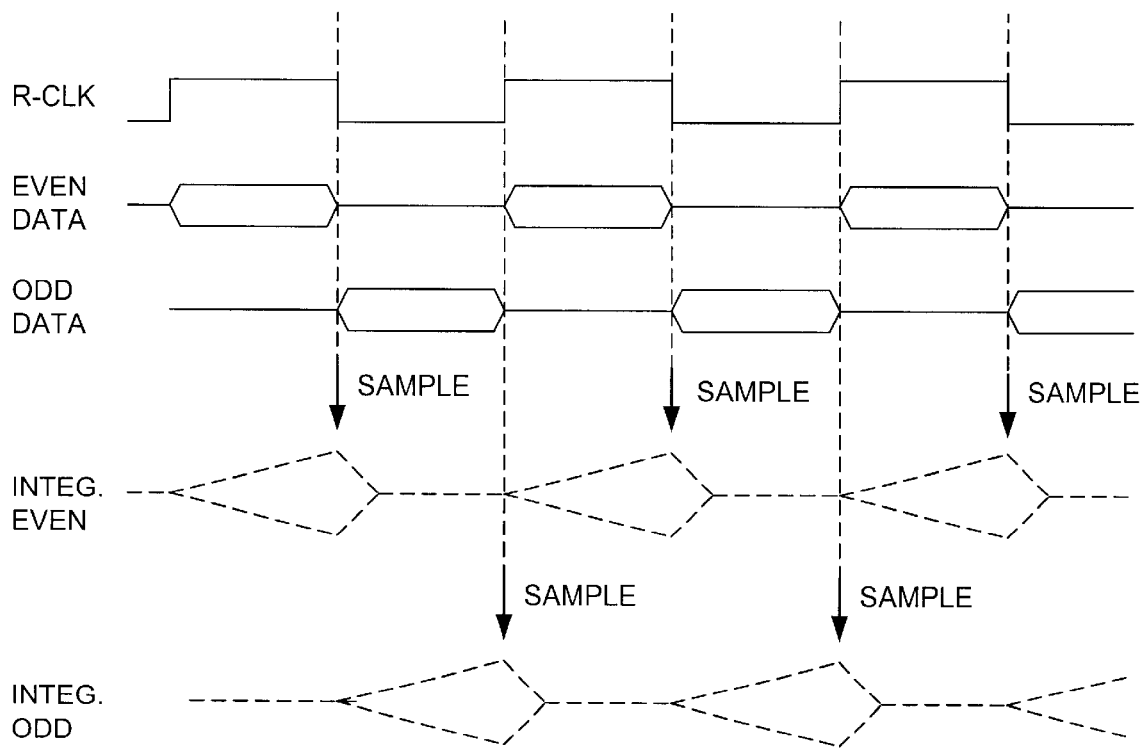
FIG. 6 is a timing diagram illustrating the manner in which data is sampled using the circuit shown in FIG. 4.

FIG. 6 is a timing diagram illustrating the manner in which data is sampled using the circuit shown in FIG. 4. The integration sampler 204 (FIG. 4) samples the entire time period during which the data should be valid instead of sampling a single point of data (e.g., at the center of the time during which the data should be valid). Since the data is sampled for the time period the data should be valid, the integration sampler 204 requires a clock that is aligned with the data being sampled (i.e., aligned with the time periods during which the data should be valid). For example, FIG. 6 shows the integration of the even data during the period in which the even data is valid (i.e., when R-CLK is high). In this example, the integration sampler 204 begins sampling the value of the even data on the rising edge of R-CLK and continues sampling and integrating the sampled values until the falling edge of R-CLK. When the falling edge of R-CLK is reached, the integration sampler 204 determines the value of the data sampled, i.e., a logic "1" or "0". Next, the integration sampler 204 begins sampling the value of the odd data on the falling edge of R-CLK and continues sampling and integrating the sampled values until the rising edge of R-CLK. At this point, the integration sampler 204 determines whether a logic "1" or a logic "0" was sampled. The integration sampler 204 then begins sampling the value of the even data, and repeats this cycle of alternating between sampling of even data and odd data.

Figure 7:
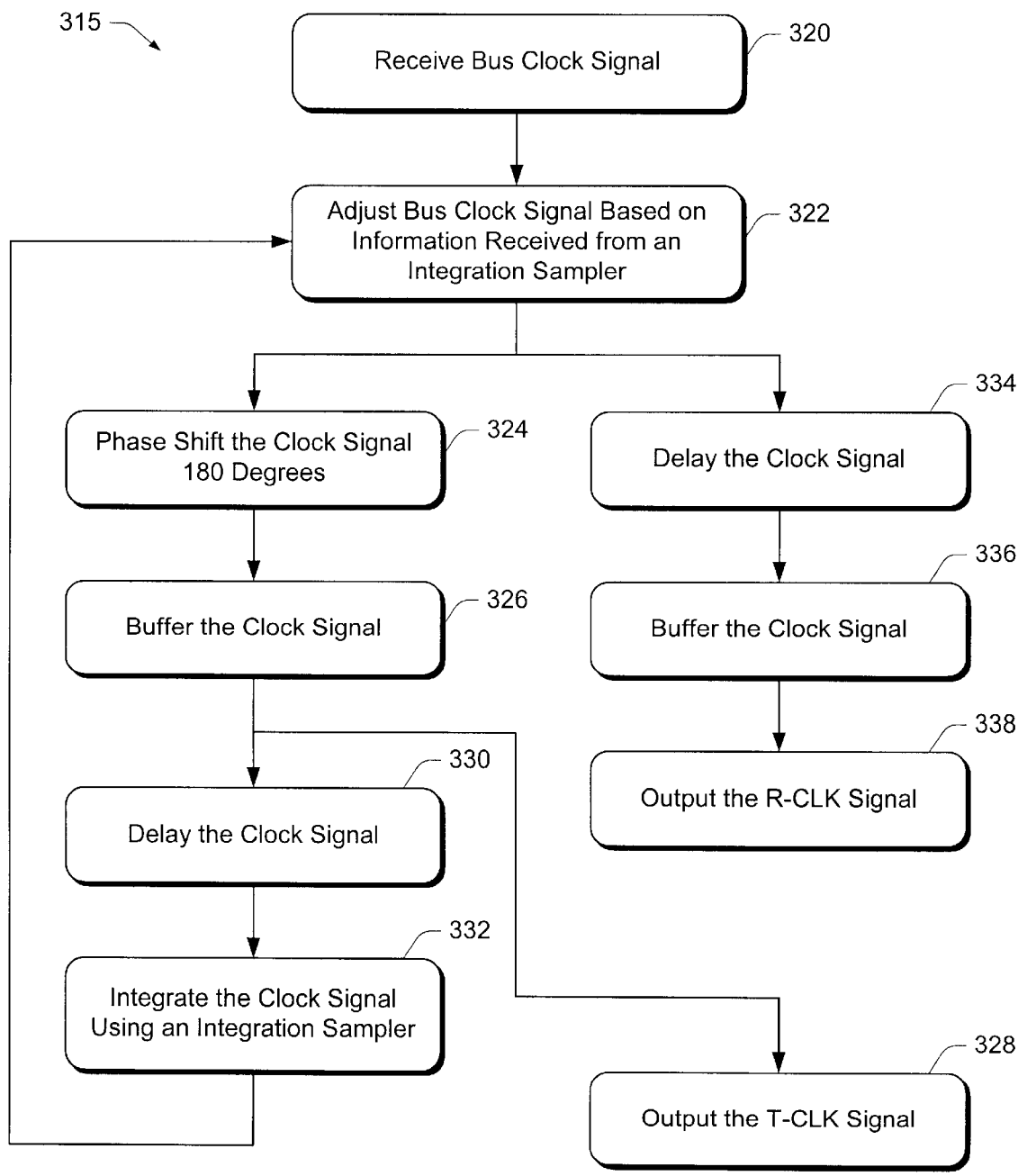
FIG. 7 is a flow diagram illustrating a procedure for generating the T-CLK and R-CLK signals.

FIG. 7 is a flow diagram illustrating a procedure 315 for generating the T-CLK and R-CLK signals. The procedure 315 is initiated by receiving a bus clock signal (e.g., BUS CLK) from the bus (block 320). The bus clock signal is adjusted based on information received from an integration sampler (block 322). The adjusted bus clock signal is then processed along two parallel paths, one path generates the T-CLK signal and the other path generates the R-CLK signal.

Along the first path, the clock signal is phase shifted by 180 degrees (block 324) and buffered (block 326). After buffering the clock signal, the procedure outputs the T-CLK signal (block 328) and provides the same clock signal to a block that delays the clock signal (block 330). The clock signal is delayed to compensate for the delay caused by the output buffer. Next, the delayed clock signal is integrated using an integration sampler (step 332). The integration results are provided back to block 322, which adjusts the incoming bus clock signal based on the integration results.

Along the second path, the clock signal is delayed (block 334) to compensate for the delay caused by the output driver in making data available on the data bus. Next, the delayed clock signal is buffered (block 336) and the procedure outputs the R-CLK signal (block 338), for example to an integration sampler. Thus, the procedure 315 shown in FIG. 7 generates both the T-CLK and the R-CLK signals from a single bus clock signal. In a particular embodiment of procedure 315, delays associated with blocks 328, 330, and 334 are approximately equal. Similarly, delays associated with blocks 326 and 336 are approximately equal.

In an alternate embodiment, the integration sampler 204 shown in FIG. 4 can be implemented as a quadrature phase detector.

Figure 8:
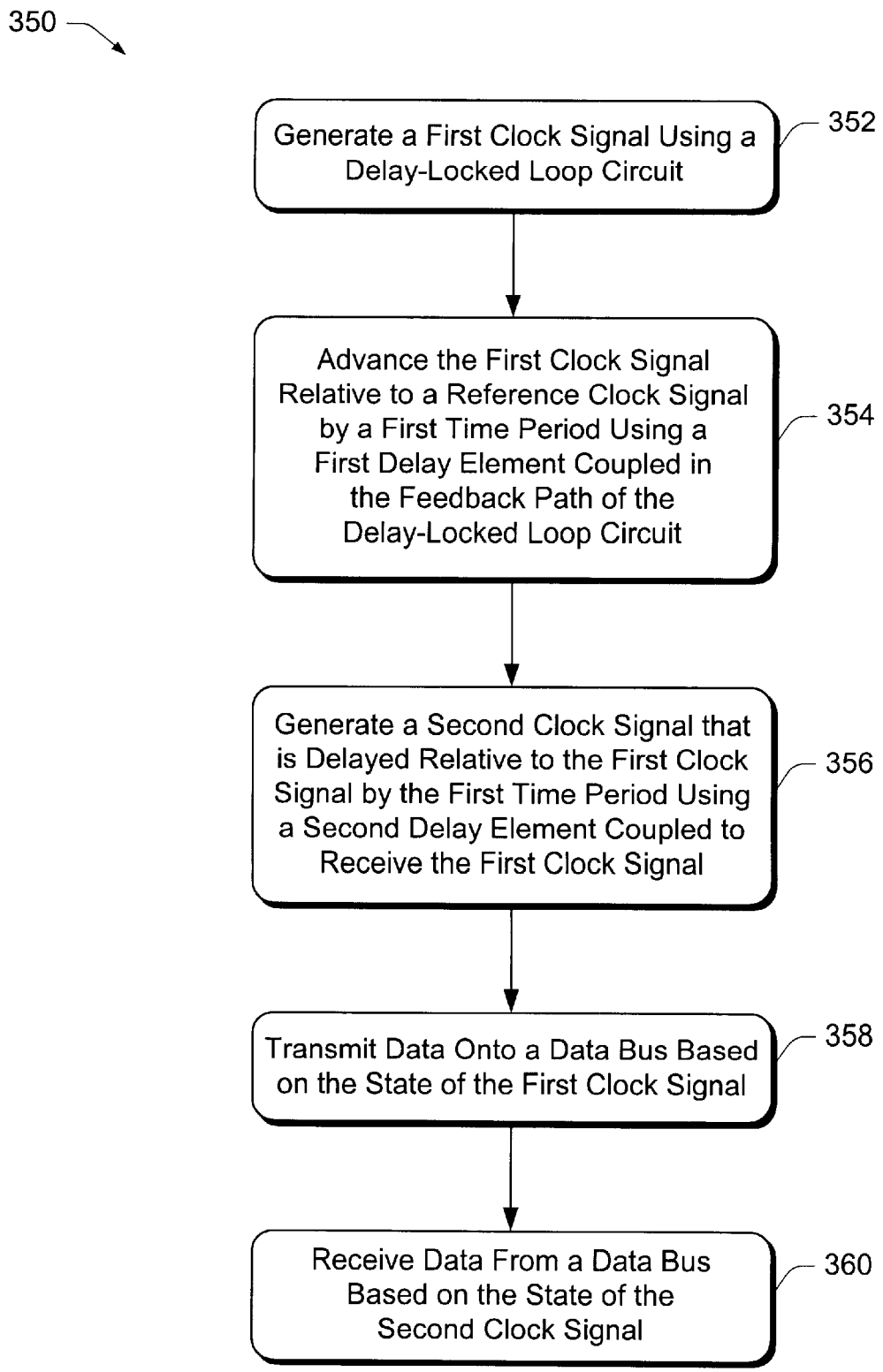
FIG. 8 is a flow diagram illustrating a procedure for generating multiple clock signals from a single reference clock signal using a single delay-locked loop.

FIG. 8 is a flow diagram illustrating a procedure 350 for generating multiple clock signals from a single reference clock signal using a single delay-locked loop. Procedure 350 begins by generating a first clock signal using a delay-locked loop circuit (block 352). The first clock signal is then advanced relative to a reference clock signal by a first time period using a first delay element coupled in the feedback path of the delay-locked loop circuit (block 354). The procedure 350 generates a second clock signal that is delayed relative to the first clock signal by the first time period using a second delay element coupled to receive the first clock signal (block 356). Data is transmitted onto a data bus based on the state of the first clock signal (block 358) and data is read from the data bus based on the state of the second clock signal (block 360).

Figure 1:
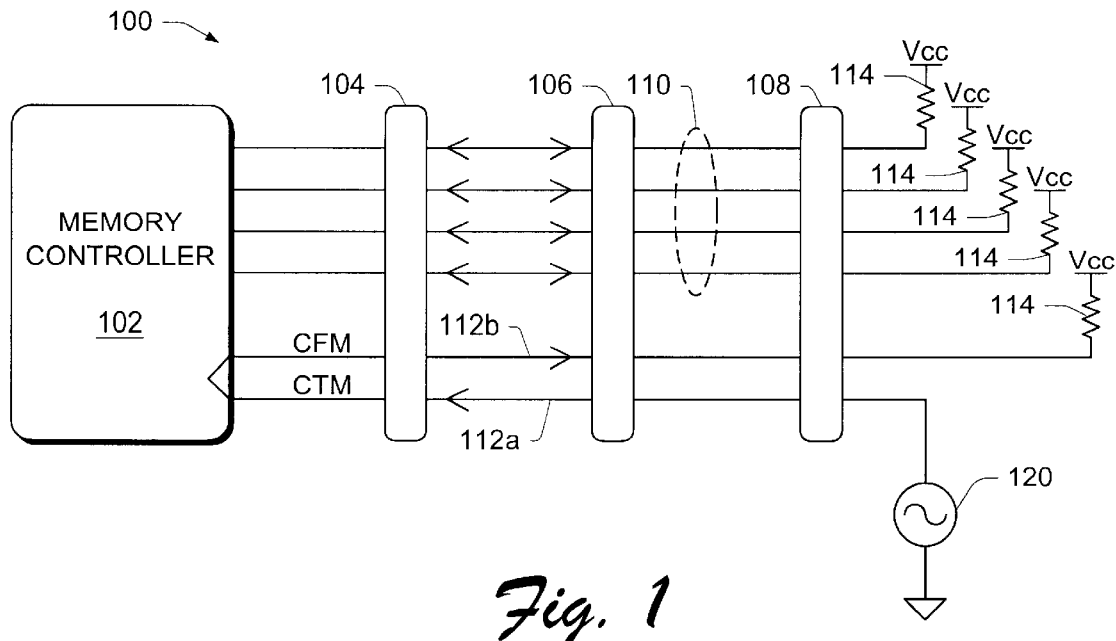
FIG. 1 illustrates a particular example of a data storage system.
Figure 9:
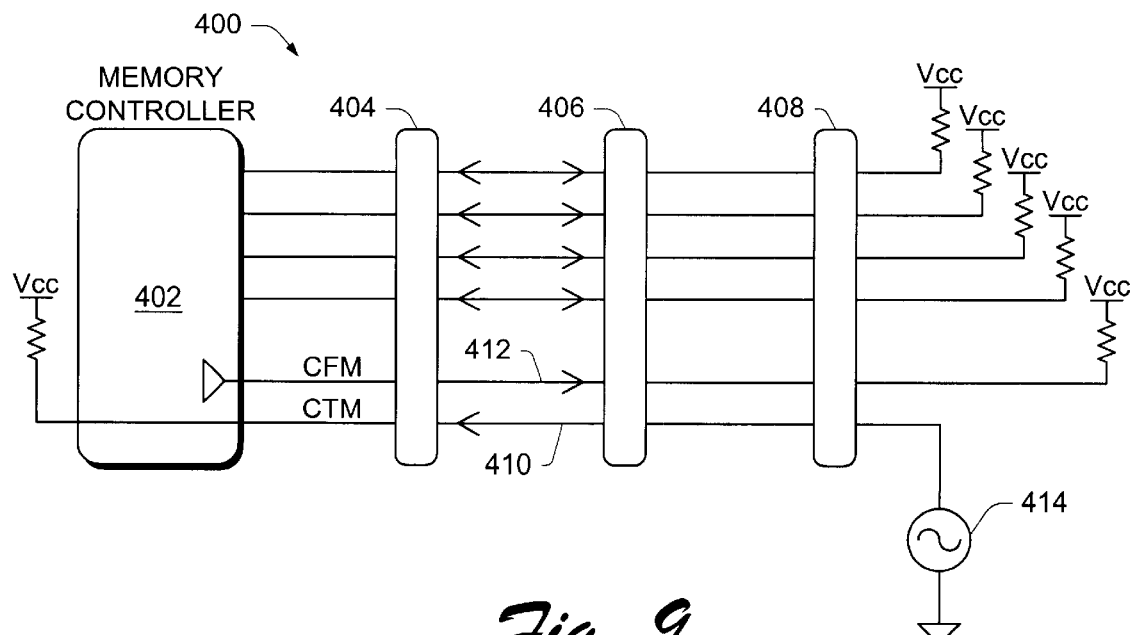
FIG. 9 illustrates an alternate example of a data storage system.

FIG. 9 illustrates an alternate example of a data storage system 400. Data storage system 400 is similar to the system 100 illustrated in FIG. 1, but a pair of clock lines 410 and 412 that propagate the CTM and CFM clock signals are decoupled from one another. The CTM clock signal is generated by a clock generator 414. A memory controller 402 receives CTM on line 410, which is terminated through a resistor coupled to Vcc rather than looped-back to CFM, as shown in FIG. 1. The CFM signal is generated by memory controller 402 on line 412. Memory controller 402 controls the reading of data from and the writing of data to one or more memory storage modules 404, 406, and 408.

Figure 10:
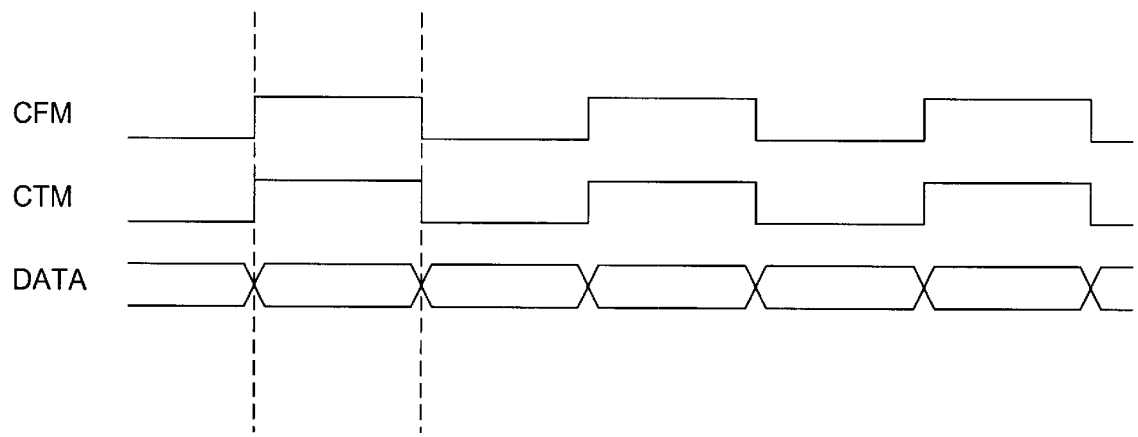
FIG. 10 is a timing diagram illustrating various clock and data signals generated by the system shown in FIG. 8.

FIG. 10 is a timing diagram illustrating various clock and data signals generated by the system shown in FIG. 9. In this example, the two clock signals CTM and CFM are decoupled from one another, but are still in alignment with each other at the memory controller. As shown in FIG. 10, the rising edge and the falling edge of CFM or CTM corresponds to the end of one valid data window and the beginning of another valid data window.

Figure 11:
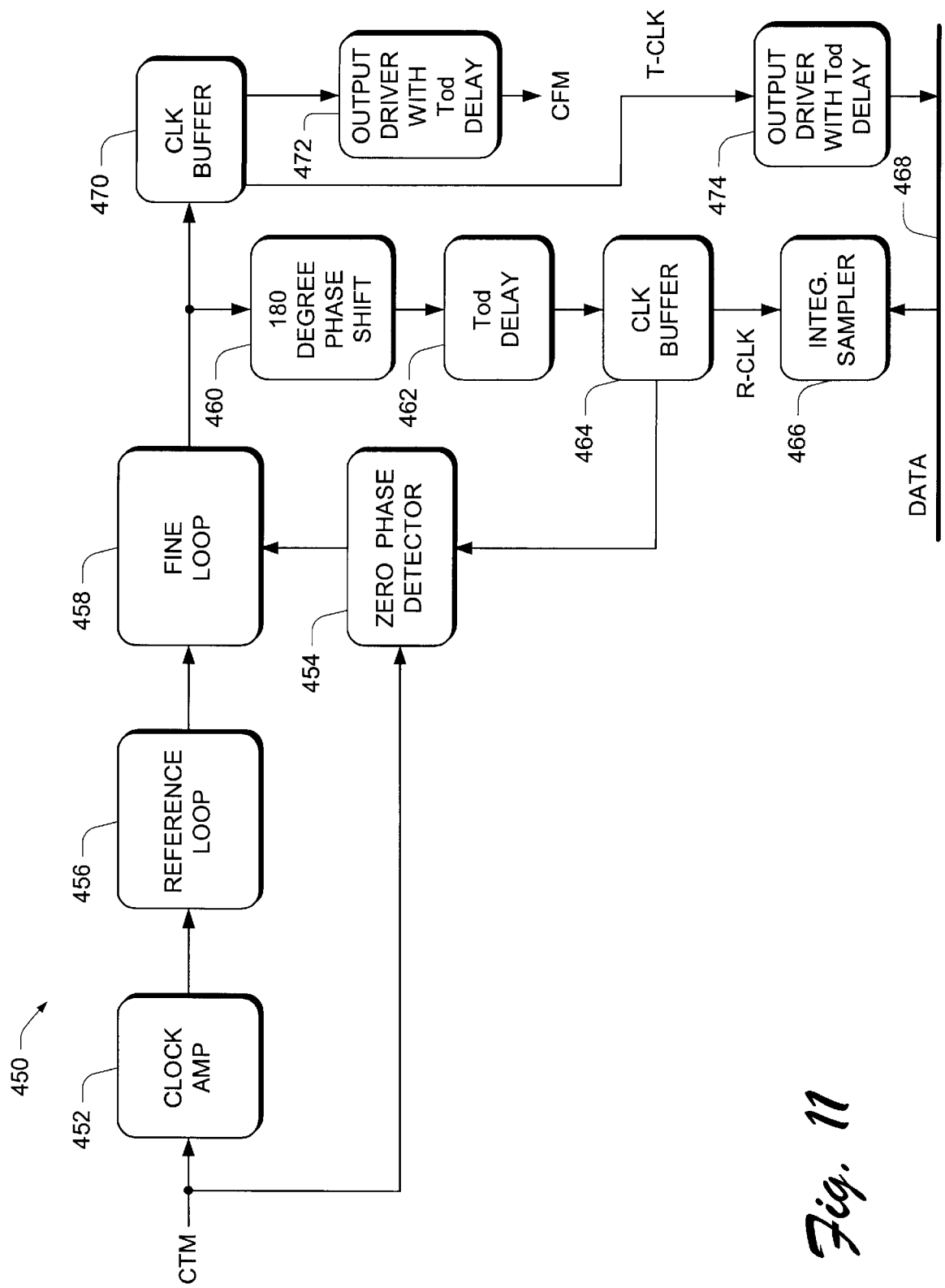
FIG. 11 illustrates another embodiment of a circuit containing a single delay-locked loop.

FIG. 11 illustrates another embodiment of a circuit 450 containing a single delay-locked loop. The circuit 450 shown in FIG. 11 is similar to circuit 200 shown in FIG. 4, but modified to accommodate the different relationship of the clock signals to the data. As discussed above, the CTM and CFM clock signals are aligned with one another and the starting and ending points of a valid data window align with a rising edge and a falling edge of CTM/CFM, or vice versa. A clock amplifier 452 receives the CTM signal, and outputs a signal to a reference loop 456 and a zero phase detector 454. The zero phase detector 454 is used instead of an integration sampler or a quadrature phase detector because the clock signals and the data are in phase alignment with one another (as shown in FIG. 10).

A fine loop 458 receives signals from the reference loop 456 and the zero phase detector 454. Fine loop 458 outputs a signal to a 180 degree phase shifter 460 and a clock buffer 470. The phase-shifted signal generated by phase shifter 460 is provided to a Tod delay circuit 462 and continues to a clock buffer 464. The output of clock buffer 464 is the R-CLK signal. The output of the clock buffer is provided to the zero phase detector 454 and an integration sampler 466, which receives data from a data bus 468. Thus, a delay-locked loop is created by fine loop 458, 180 degree phase shift circuit 460, Tod delay circuit 462, clock buffer 464, and zero phase detector 454.

The clock buffer 470 provides a buffered output signal to a pair of output drivers 472 and 474, each of which include a Tod delay. The output signal provided from the clock buffer 470 to output driver 474 is the T-CLK signal. Output driver 472 generates a CFM signal and output driver 474 provides an output signal to the data bus 468.

Figure 12:
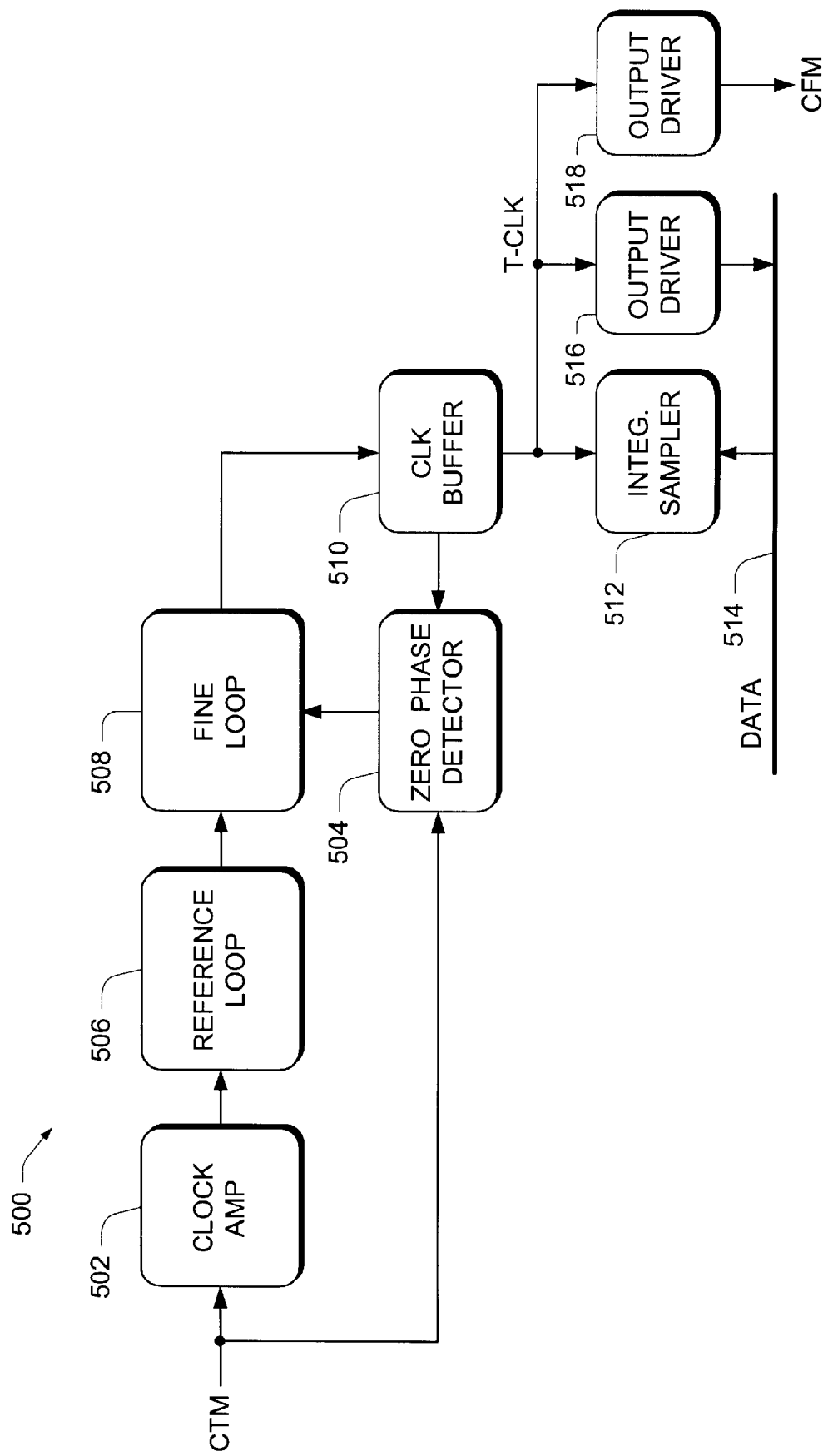
FIG. 12 illustrates a further embodiment of a circuit containing a single delay-locked loop in which the CTM and CFM signals are a synchronous.

FIG. 12 illustrates a further embodiment of a circuit 500 containing a single delay-locked loop in which the CTM and CFM signals are a synchronous (i.e., CTM and CFM are not in alignment with each another at the memory controller). Circuit 500 is similar to circuit 450 in FIG. 11, but with several of the phase shifting and delay components removed because when CFM and the data are in alignment, no additional delays are required.

A clock amplifier 502 and a zero phase detector receive the CTM clock signal. The output of clock amplifier 502 is provided to a reference loop 506. A fine loop 508 receives signals from the reference loop 506 and the zero phase detector 504. The output generated by fine loop 508 is provided to a clock buffer 510. The output of the clock buffer 510 is the T-CLK signal, which is the same as the R-CLK signal in this circuit 500. The output of the clock buffer 510 is provided to the zero phase detector 504, an integration sampler 512, and a pair of output drivers 516 and 518. The integration sampler 512 receives data from a data bus 514. Output driver 516 provides its output to data bus 514 and output driver 518 generates a CFM clock signal.

Thus, a system has been described that generates multiple clock signals from a single bus clock signal. The described system uses a single delay-locked loop to generate the multiple clock signals. Using a single delay-locked loop reduces the number of components in the system, reduces the circuit's power consumption, and requires a smaller layout area within the memory controller or other device.

Although the description above uses language that is specific to structural features and/or methodological acts, it is to be understood that the invention defined in the appended claims is not limited to the specific features or acts described. Rather, the specific features and acts are disclosed as exemplary forms of implementing the invention.

What is claimed is:

1. An apparatus comprising:
    a delay-locked loop circuit to generate a first clock signal, the delay-locked loop circuit including a first delay element coupled in a feedback path of the delay-locked loop circuit to advance the first clock signal relative to a reference clock signal by a first time period;
    a second delay element coupled to receive the first clock signal from the delay-locked loop circuit and to output a second clock signal that is delayed relative to the first clock signal by the first time period; and
    a third delay element coupled between the delay-locked loop circuit and the second delay element.

2. An apparatus as recited in claim 1 wherein the third delay element is a clock buffer.

3. An apparatus as recited in claim 1 wherein the third delay element is coupled to an output driver.

4. An apparatus as recited in claim 1 wherein the delay-locked loop circuit further includes a phase detector to identify phase differences between the first clock signal and the reference clock signal.

5. An apparatus as recited in claim 4 wherein the phase detector is a zero phase detector.

6. An apparatus as recited in claim 1 wherein the delay-locked loop circuit further includes a 180 degree phase shifter to adjust the phase of the first clock signal.

7. A memory system comprising:
    a memory storage device;
    a data bus coupled to the memory storage device; and
    a memory controller coupled to the data bus, the memory controller including:
        a delay-locked loop circuit to generate a first clock signal, the delay-locked loop circuit including a first delay element coupled in a feedback path of the delay-locked loop circuit to advance the first clock signal relative to a reference clock signal by a first time period;
        a second delay element coupled to receive the first clock signal from the delay-locked loop circuit and to output a second clock signal that is delayed relative to the first clock signal by the first time period; and
        a third delay element coupled between the delay-locked loop circuit and second delay element.

* * * * *

UNITED STATES PATENT AND TRADEMARK OFFICE
CERTIFICATE OF CORRECTION

PATENT NO.    : 6,469,555 B1
DATED         : October 22, 2002
INVENTOR(S)   : Lau et al.

It is certified that error appears in the above-identified patent and that said Letters Patent is hereby corrected as shown below:

Column 2,
Line 64, replace "clement" with -- element --.

Column 3,
Line 45, replace "a synchronous" with -- asynchronous --.

Signed and Sealed this

Twenty-fifth Day of February, 2003

JAMES E. ROGAN
*Director of the United States Patent and Trademark Office*